United States Patent
Johnson

(10) Patent No.: US 8,192,641 B2
(45) Date of Patent: Jun. 5, 2012

(54) METHODS FOR FABRICATING NON-PLANAR ELECTRONIC DEVICES HAVING SIDEWALL SPACERS FORMED ADJACENT SELECTED SURFACES

(75) Inventor: Frank Scott Johnson, Wappinger Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 512 days.

(21) Appl. No.: 12/508,421

(22) Filed: Jul. 23, 2009

(65) Prior Publication Data
US 2011/0021027 A1 Jan. 27, 2011

(51) Int. Cl.
*B44C 1/22* (2006.01)
*C03C 15/00* (2006.01)
*C03C 25/68* (2006.01)
*C23F 1/00* (2006.01)
(52) U.S. Cl. .................. 216/46; 438/710; 438/696
(58) Field of Classification Search .............. 216/46; 438/710, 696
See application file for complete search history.

(56) References Cited

U.S. PATENT DOCUMENTS

2004/0262688 A1* 12/2004 Nowak et al. ............. 257/350
2004/0266179 A1* 12/2004 Sharma .................... 438/673

* cited by examiner

*Primary Examiner* — Roberts Culbert
(74) *Attorney, Agent, or Firm* — Ingrassia Fisher & Lorenz, P.C.

(57) ABSTRACT

Methods are provided for fabricating an electronic device having at least one sidewall spacer formed adjacent a selected surface. In one embodiment, the method includes the step of depositing spacer material adjacent first and second raised structures formed on the substrate and extending along substantially perpendicular axes. The method further includes the step of selectively removing spacer material laterally adjacent one of the first raised structure and the second raised structure. During the step of selectively removing, the electronic device is bombarded with ions from a first predetermined direction forming a first predetermined grazing angle with the substrate such that the spacer material adjacent a first sidewall of the first raised structure is substantially exposed to the ion bombardment while the spacer material adjacent opposing sidewalls of the second raised structure is substantially shielded therefrom.

20 Claims, 8 Drawing Sheets

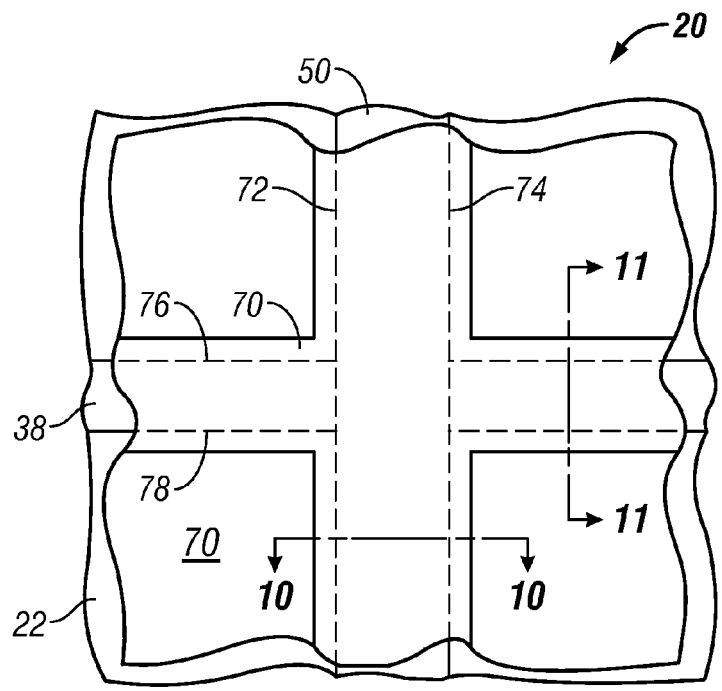
FIG. 9
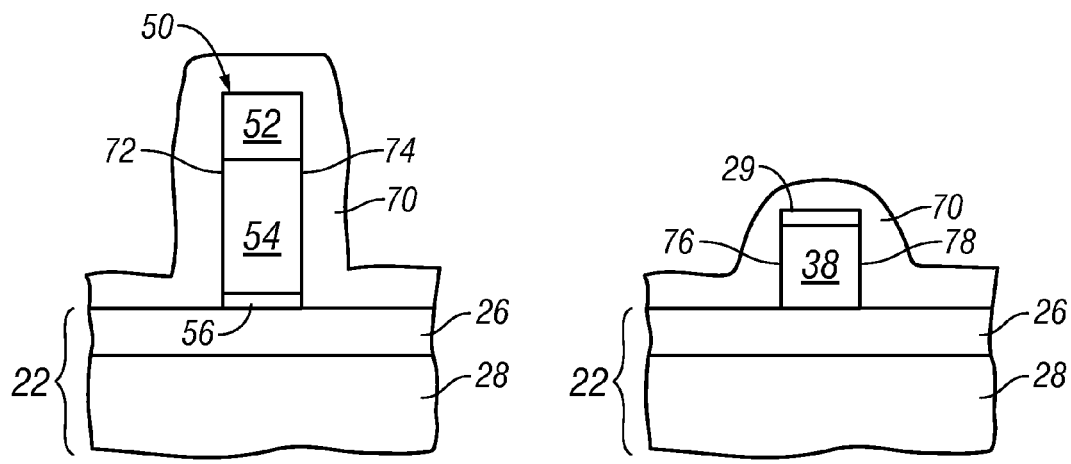
FIG. 10     FIG. 11

US 8,192,641 B2

METHODS FOR FABRICATING NON-PLANAR ELECTRONIC DEVICES HAVING SIDEWALL SPACERS FORMED ADJACENT SELECTED SURFACES

TECHNICAL FIELD

The present invention relates generally to the fabrication of small scale electronic devices and, more particularly, to methods for fabricating non-planar semiconductor devices (e.g., FinFETs) and other small scale electronic devices wherein sidewall spacers are formed adjacent a first raised structure (e.g., a fin structure) without simultaneously forming sidewall spacers adjacent a second raised structure (e.g., a gate stack).

BACKGROUND

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved. One known type of non-planar, multi-gate transistor, commonly referred to as a "FinFET," includes two or more parallel fin structures (the "fins") formed on a substrate, such as a silicon-on-insulator substrate. The fins extend along a first axis between common source and drain electrodes. At least one conductive gate structure (the "gate") is formed over the fins and extends along a second axis generally perpendicular to the first axis. More specifically, the gate extends across and over the fins such that an intermediate portion of the gate conformally overlays three surfaces of each fin (i.e., an upper surface, a first sidewall surface, and a second opposing sidewall surface of each fin).

While providing the advantages noted above, FinFETs and other non-planar multi-gate devices (e.g., triFETs) can be somewhat difficult to fabricate due to their unique topographies. For example, in the case of a simplified FinFET including two fins and one gate, it is difficult to form sidewall spacers adjacent opposing sidewalls of the gate without simultaneously forming parasitic sidewall spacers adjacent opposing sidewalls of the fins. In one known fabrication technique, at least one layer of spacer material (e.g., silicon nitride or silicon oxide) is blanket deposited over the fins and the gate. One or more etching steps are then performed to remove the spacer material adjacent the fins while leaving intact portions of the spacer material adjacent opposing sidewalls of the gate. The remaining portions of the spacer material adjacent the gate thus serve as sidewall spacers in subsequent fabrication processes.

While permitting the selective formation of sidewall spacers adjacent a gate, the above-described fabrication technique is limited in several respects. Most notably, in the above-described fabrication technique, the etching process is typically required to continue significantly beyond the traditional etch endpoint (i.e., a prolonged over-etch is performed) to ensure that the spacer material adjacent opposing sidewalls of the fins is removed in its entirety. In many cases, the over-etch may approach or exceed 400% of ideal thickness removal. Due to its severity, this over-etch has several undesirable consequences. First, a considerable volume of spacer material is removed from the gate during the etching process thus potentially exposing the fin-gate intersection. Although the height of the gate may be increased to ensure that the etch does reach the fin-gate intersection, an increase in gate height results in a corresponding increase in gate capacitance. Second, the prolonged over-etch may remove an excessive volume of hardmask material overlying the gate structure, which can render subsequent selective epitaxial growth processes more difficult. Third, exposure of the substrate to prolonged over-etching may undercut the fins and thus remove structure support therefrom. Fourth, the source/drain area of the fins' sidewalls can be undesirably roughened or otherwise damaged by prolonged exposure to over-etching. Fifth, prolonged over-etching may result in significant variations in the dimensions (e.g., width) of the final sidewall spacers. Finally, as a still further limitation, prolonged over-etching removes dielectric material overlying the fins, which renders subsequent usage of the dielectric material as a strain layer more difficult.

There thus exists an ongoing need to provide embodiments of a method for fabricating a non-planar semiconductor device, such as a FinFET, wherein sidewall spacers are formed adjacent the gate without simultaneously forming sidewall spacer adjacent the fins that minimizes or eliminates over-etching requirements. More generally, there exists an ongoing need to provide embodiments of a method for forming sidewall spacers adjacent selected surfaces on a non-planar semiconductor device or other small scale electronic device that includes first and second raised structures extending along substantially perpendicular axes. Other desirable features and characteristics of the present invention will become apparent from the subsequent Detailed Description and the appended Claims, taken in conjunction with the accompanying Drawings and this Background.

BRIEF SUMMARY

Methods are provided for fabricating an electronic device having at least one sidewall spacer formed adjacent a selected surface. In one embodiment, the method includes the step of depositing spacer material adjacent first and second raised structures formed on the substrate and extending along substantially perpendicular axes. The method further includes the step of selectively removing spacer material laterally adjacent one of the first raised structure and the second raised structure. During the step of selectively removing, the electronic device is bombarded with ions from a first predetermined direction forming a first predetermined grazing angle with the substrate such that the spacer material adjacent a first sidewall of the first raised structure is substantially exposed to the ion bombardment while the spacer material adjacent opposing sidewalls of the second raised structure is substantially shielded therefrom.

BRIEF DESCRIPTION OF THE DRAWINGS

The present invention will hereinafter be described in conjunction with the following drawing figures, wherein like numerals denote like elements, and wherein:

FIGS. 9-17 are simplified cross-sectional and top views illustrating various steps included within a first exemplary method for selectively producing sidewall spacers adjacent the gate stack included within the exemplary FinFETs illustrated in FIGS. 1-8.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

The following describes multiple exemplary embodiments of a fabrication method wherein sidewall spacers are selectively formed adjacent opposing sidewalls of one or more raised structures on a small scale electronic device. Relative to conventional spacer-forming techniques typically utilized in the fabrication of non-planar, multi-gate semiconductor devices, embodiments of the method described herein significantly reduce or eliminate over-etching requirements. Embodiments of the method described herein are especially well-suited for selectively producing sidewall spacers adjacent opposing sidewalls of one or more gate stacks included within a non-planar, multi-gate transistor device, such as a FinFET; for this reason, and by way of non-limiting illustration only, the following describes two exemplary embodiments of the method in the context of an exemplary semiconductor device including a plurality of FinFETs. It is, however, emphasized that embodiments of the method can also be utilized to form sidewall spacers at selected locations on various other types of small scale electronic devices including, for example, micromachined devices and optical devices.

Figure 1:
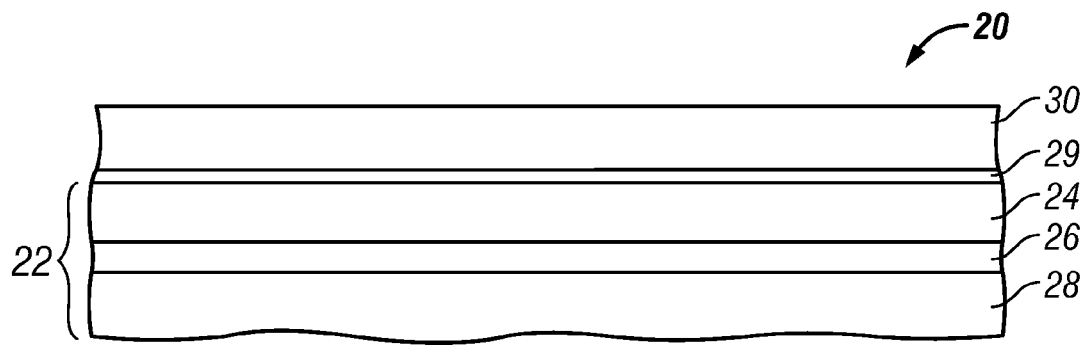
FIGS. 1-8 are simplified cross-sectional and top views illustrating various steps included within an exemplary method for producing a partially-completed semiconductor device including a number of FinFETs.

Referring initially to FIG. 1, an exemplary method of fabrication suitable producing a semiconductor device 20 commences with the provision of a silicon substrate 22. As appearing herein, the term "silicon substrate" encompasses the relatively pure silicon materials typically employed in the semiconductor industry, as well as silicon admixed with other elements, such as germanium, carbon, and the like. Silicon substrate 22 can be a bulk silicon wafer. However, as indicated in FIG. 1, silicon substrate 22 preferably assumes the form of a silicon-on-insulator (SOI) wafer including an upper silicon layer 24 overlying an intermediate insulating layer 26 (also commonly referred to as a "buried oxide" or "BOX" layer), which is supported by a silicon carrier wafer 28. A mandrel-forming layer 30 is deposited over upper silicon layer 24 of silicon substrate 22 utilizing a known deposition technique, such as chemical vapor deposition. Mandrel-forming layer 30 can comprise various types of materials including, for example, polycrystalline silicon, silicon oxynitride, silicon oxide, silicon nitride, and the like. If desired, one or more intervening layers (e.g., a hard mask layer) can be formed between mandrel-forming layer 30 and upper silicon layer 24 of silicon substrate 22; for example, a silicon nitride layer 29 may be formed between mandrel-forming layer 30 and upper silicon layer 24 as illustrated in FIG. 1.

Figure 2:
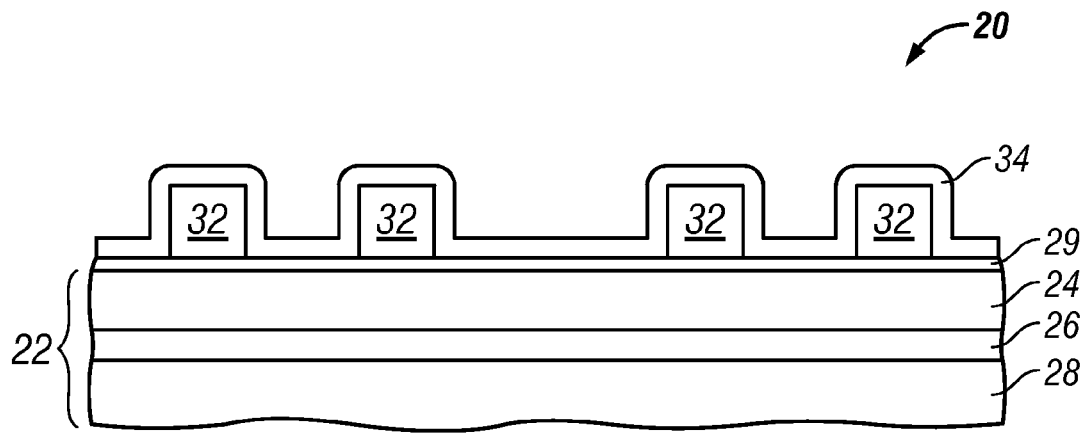

As illustrated in FIG. 2, selected portions of mandrel-forming layer 30 are next removed to create a number of sacrificial mandrels 32 along the upper surface of silicon nitride layer 29 and, more generally, along the upper surface of silicon substrate 22. The selected portions of mandrel-forming layer 30 can be removed by first depositing photoresist over mandrel-forming layer 30, patterning the photoresist, etching the portions of mandrel-forming layer 30 exposed through patterned photoresist, and subsequently removing the patterned photoresist. If desired, a plasma etching process can be utilized to remove the portions of mandrel-forming layer 30 exposed through the patterned photoresist or other mask. More specifically, a reactive ion etch process can be performed utilizing a chemistry selective to mandrel-forming layer 30. For example, if mandrel-forming layer 30 is formed from silicon nitride, a trifluoride/oxygen chemistry can be utilized; if mandrel-forming layer 30 is formed from silicon oxynitride or silicon oxide, a carbon hydro-trifluoride or tetrafluoromethane chemistry can be utilized; and if mandrel-forming layer 30 is formed from polycrystalline silicon, a chloride or bromous acid chemistry can be utilized.

After etching mandrel-forming layer 30 to yield sacrificial mandrels 32 in the above-described manner, a first spacer-forming layer 34 is deposited over sacrificial mandrels 32 and silicon nitride layer 29 (FIG. 2). Spacer-forming layer 34 is conveniently formed via the blanket deposition of silicon nitride, silicon oxide, or another suitable dielectric material. In a preferred group of embodiments, the composition of first spacer-forming layer 34 is chosen to permit sacrificial mandrels 32 to be removed via a subsequent etching process that is selective to mandrel-forming layer 30 over spacer-forming layer 34; e.g., mandrel-forming layer 30 and spacer-forming layer 34 may comprise silicon nitride and silicon oxide, respectively, thereby permitting sacrificial mandrels formed from mandrel-forming layer 30 to be selectively removed utilizing a hot phosphoric acid wet etch. The thickness to which first spacer-forming layer 34 is deposited will generally depend upon the desired critical dimensions of the final fin structure; however, as a non-limiting example, first spacer-forming layer 34 may be deposited to a thickness of approximately 15 nanometers (nm) to approximately 40 nm.

Figure 3:
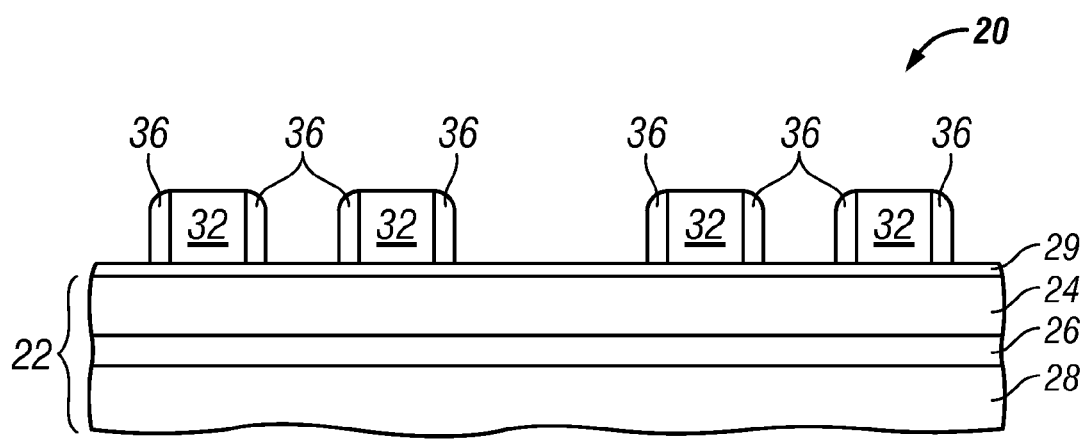
Figure 4:
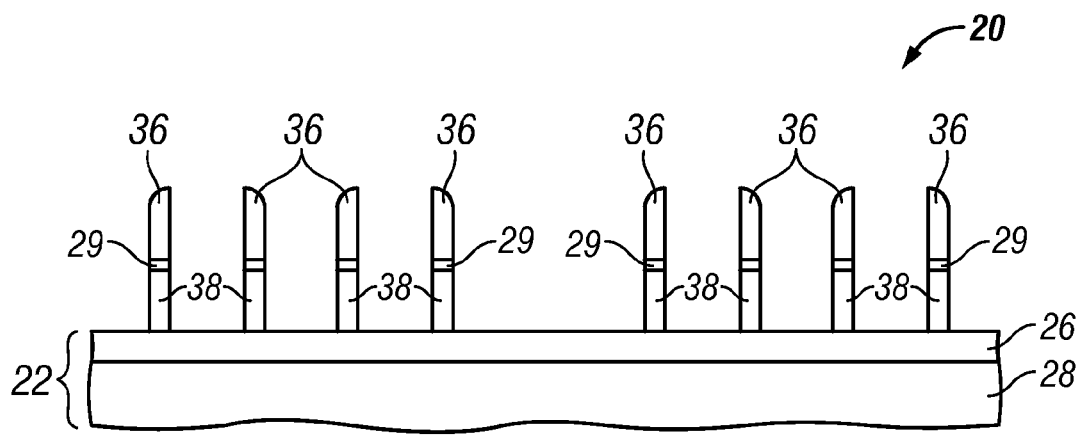

With reference to FIGS. 3 and 4, partially-completed semiconductor device 20 is next subjected to a series of etching steps. As indicated in FIG. 3, an anisotropic or directional etch is first performed to remove selected portions of first spacer-forming layer 34 and thereby create sidewall spacers 36 adjacent opposing sides of each sacrificial mandrel 32. Next, as indicated in FIG. 4, a second etching process is performed to selectively remove sacrificial mandrels 32 while leaving intact the bulk of sidewall spacers 36; e.g., as previously stated, sacrificial mandrels 32 can be selectively removed utilizing a hot phosphoric acid wet etch in embodiments wherein sacrificial mandrels 32 are formed from a layer of silicon nitride and sidewall spacers 36 are formed from a layer of silicon oxide. After removal of sacrificial mandrels 32, one or more additional etching steps are performed to remove the portions of silicon nitride layer 29 and upper silicon layer 24 that are not located beneath sidewall spacers 36. These latter etching steps result in the formation of a plurality of fin structures 38 overlying insulating layer 26 of silicon substrate 22; in the illustrated portion of exemplary semiconductor device 20, eight such fin structures 38 are formed.

Figure 5:
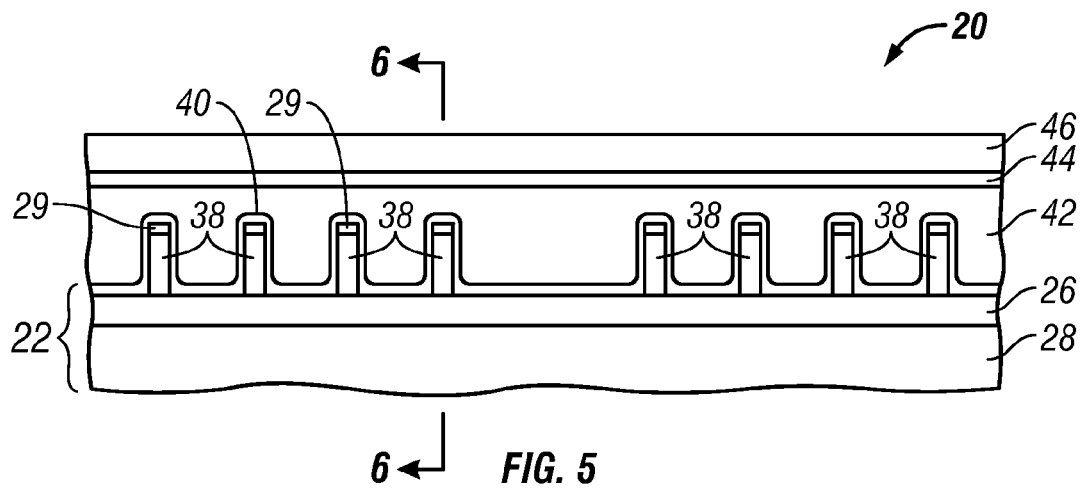

As illustrated in FIG. 5, the method continues with the removal of sidewall spacers 36 utilizing either a wet or dry etching process. A chemistry selective to sidewall spacers 36 is preferably employed during the etching process to minimize erosion of fin structures 38; e.g., if sidewall spacers 36 comprise silicon oxide, a carbon hydro-trifluoride or tetrafluoromethane chemistry can be utilized. After removal of sidewall spacers 36, a gate insulator layer 40 is formed over fin structures 38 and the upper surface of silicon substrate 22. Gate insulator layer 40 can comprise any of the conventional gate-insulating materials for insulating fin structures 38 from the conductive gate electrode layer formed above fin structures 38 as described below. As a first example, gate insulator layer 40 can comprise silicon dioxide ($SiO_2$) thermally grown in an oxidizing ambient. Alternatively, and as a second example, gate insulator layer 40 can comprise a high-k dielectric material deposited over fin structures 38 and the exposed upper surface of silicon substrate 22 utilizing a vapor deposition process, such as chemical vapor deposition (CVD), low pressure chemical vapor deposition (LPCVD), or plasma enhanced chemical vapor deposition (PECVD). A non-exhaustive list of high-k dielectric materials that may be deposited to form gate insulator layer 40 includes hafnium dioxide, hafnium silicon oxide, titanium dioxide, tantalum pentoxide, zirconium dioxide, and various other compounds that have a relatively high dielectric constant as compared to silicon dioxide or silicon oxynitride. The thickness of gate insulator layer 40 will vary depending upon the desired performance characteristics of semiconductor device 20; however, it is generally preferred that gate insulator layer 40 is deposited to a thickness less than approximately 10 nm.

With continued reference to FIG. 5, a conductive gate electrode layer 42 is next deposited over gate insulator layer 40 utilizing a conventional deposition technique, such as CVD, LPCVD, or PECVD. A non-exhaustive list of conductive materials suitable for use in the formation of gate electrode layer 42 includes a polycrystalline silicon and various metals and alloys, such as titanium nitride, tantalum nitride, hafnium silicide, and tantalum carbide. After deposition of gate electrode layer 42, one or more mask layers are deposited over gate electrode layer 42. In the exemplary embodiment illustrated in FIG. 5, specifically, a single nitride capping layer 44 is deposited over conductive gate electrode layer 42. Nitride capping layer 44 can comprise silicon nitride deposited over gate electrode layer 42 utilizing a low temperature deposition process, such as PECVD, performed utilizing silane, ammonia, and/or nitrogen in the presence of an argon plasma.

Figure 6:
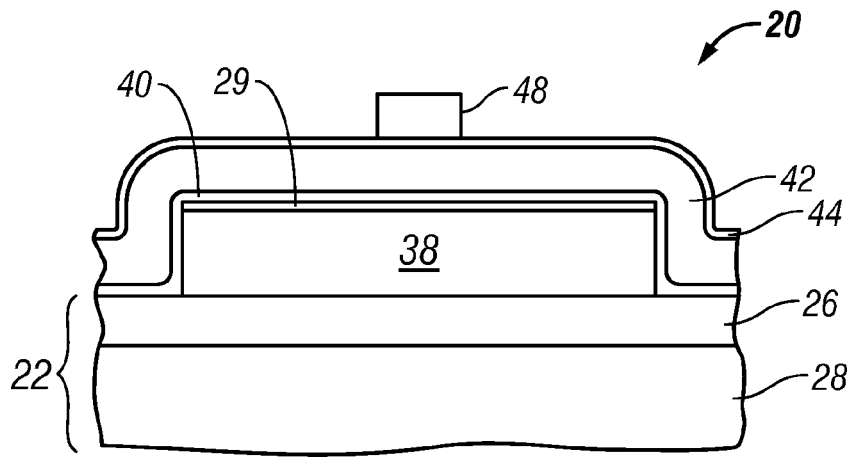
Figure 7:
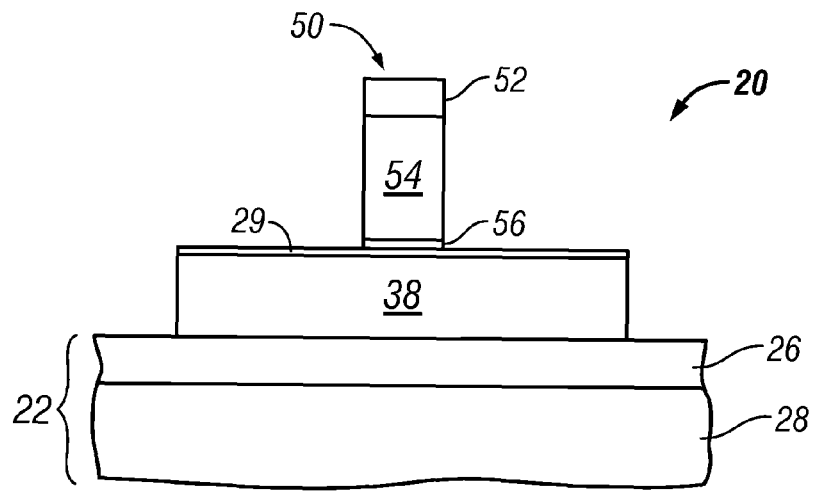

A photoresist layer 46 (FIG. 5) is next deposited over nitride capping layer 44 and patterned utilizing a photolithography process. As indicated in FIG. 6, which is a cross-sectional view of semiconductor device 20 taken along line 6-6 (identified in FIG. 5), photolithography of photoresist layer 46 creates at least one mask structure 48 along the upper surface of nitride capping layer 44. With reference to FIG. 7, one or more etching processes are then performed to define at least one gate stack 50 from the portions of nitride capping layer 44, conductive gate electrode layer 42, and gate insulator layer 40 that are not located beneath mask structures 48. In the illustrated exemplary embodiment, gate stack 50 includes: (i) a nitride cap 52 formed from nitride capping layer 44, (ii) a conductive gate electrode 54 formed from gate electrode layer 42, and (iii) a gate insulator 56 formed from gate insulator layer 40. Mask structure 48 is subsequently removed utilizing a conventional etching process.

Figure 8:
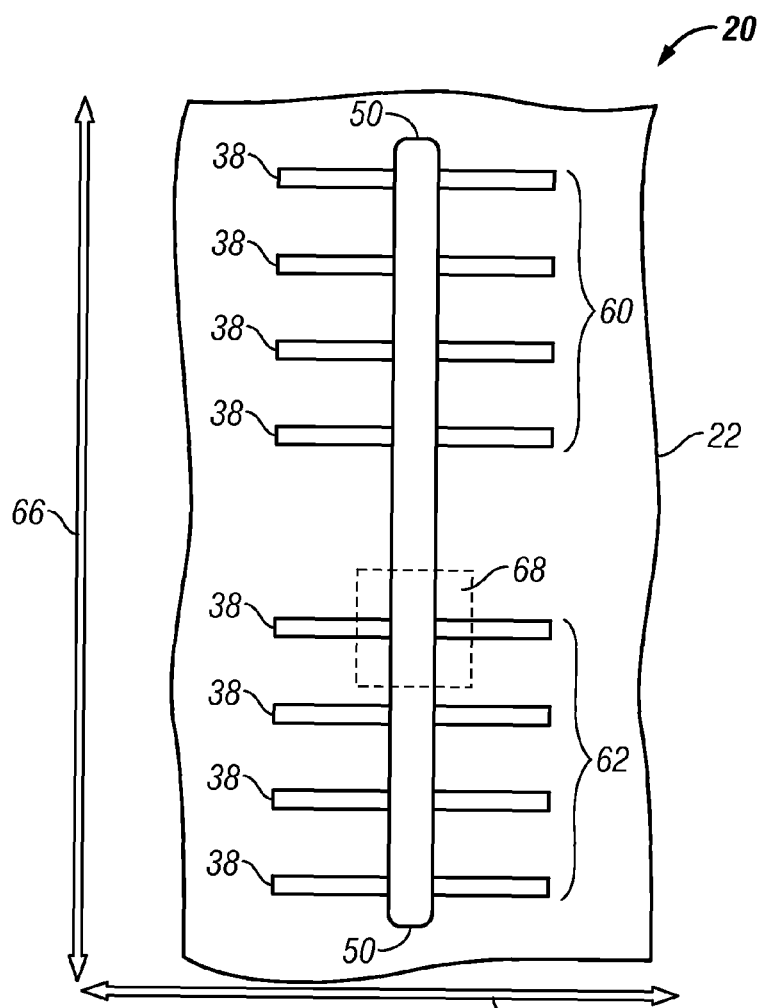

FIG. 8 is a top plan view of partially-completed semiconductor device 20. In this view, it can be seen that semiconductor device 20 includes two non-planar, multi-gate transistors, namely, a first FinFET 60 and a second FinFET 62. FinFETs 60 and 62 each include a plurality of generally parallel fin structures 38, which each extend along substrate 22 in a direction generally parallel to a first main axis (represented in FIG. 8 by arrow 64). Gate stack 50 overlays and extends across fin structures 38 in a direction generally parallel to a second main axis (represented in FIG. 8 by arrow 66) and generally perpendicular to first main axis 64. As previously noted, it is desirable to form sidewall spacers adjacent opposing sidewalls of gate stack 50 without simultaneously forming parasitic sidewall spacers adjacent opposing sidewalls of fin structures 38. Conventional methods of selectively forming sidewall spacers adjacent gate stack 50 typically entail a prolonged over-etch, which may result in a number of negative consequences as described in the Background above. The following describes two exemplary embodiments of a method suitable for selectively forming sidewall spacers adjacent a first vertical surface or surfaces of a small scale electronic device (e.g., in the context of semiconductor device 20, adjacent opposing sidewalls of gate stack 50) without simultaneously forming sidewall spacers adjacent a second vertical surface or surfaces (e.g., in the context of semiconductor device 20, adjacent opposing sidewalls of fin structures 38) that significantly minimizes or entirely eliminates over-etching requirements. For ease of explanation, the following will describe the exemplary methods in conjunction with a representative portion of semiconductor device 20 (identified in FIG. 8 by dashed box 68), which includes a segment of a single fin structure 38 and a segment of a single gate stack 50. It will be understood, however, that the following discussion applies equally to the entire semiconductor device 20, as well as to other semiconductor structures (e.g., triFETs) and small scale electronic devices.

In a first exemplary embodiment, the method for selectively forming sidewall spacers commences with the blanket deposition of one or more layers of spacer material over semiconductor device 20. Further illustrating this step, FIG. 9 is a top plan view of semiconductor device 20, including gate stack 50 (shown in phantom) overlying fin structure 38 (also shown in phantom), after the blanket deposition of at least one layer of spacer material 70; FIG. 10 is a cross-sectional view of a gate stack 50 included within semiconductor device 20 taken along line 10-10 (identified in FIG. 9); and FIG. 11 is a cross-sectional view of gate stack 50 included within semiconductor device 20 taken along line 11-11 (also identified in FIG. 9). As can be seen most clearly in FIGS. 9 and 10, after blanket deposition, spacer material 70 is disposed adjacent opposing sidewalls 72, 74 of gate stack 50. Similarly, as can be seen most clearly in FIGS. 9 and 11, spacer material 70 is also disposed adjacent opposing sidewalls 76, 78 of fin structure 38 after blanket deposition.

Although illustrated generically in FIGS. 9-11 as a single layer, spacer material 70 can include multiple layers each formed from a different insulative material, such as silicon oxide, silicon nitride, or other insulating materials including, for example, an ultra-low k material. When deposited as multiple layers, spacer material 70 can be utilized to form multiple spacers that each serve one or more of the following purposes: (i) encapsulation of gate stack 50 to protect conductive gate electrode 54 from subsequent etching steps; (ii) spatial alignment (commonly referred to as "stand-off") for selective epitaxial growth of, for example, silicon germanium (eSiGe); (iii) spatial alignment for subsequent source/drain implants; and (iv) spatial alignment for subsequent source/drain extension implants. As a non-limiting example, spacer material 70 can be deposited to a total thickness of approximately 3 nm to approximately 40 nm. The foregoing example notwithstanding, embodiments of the inventive fabrication method are in no way limited to the composition of the spacer material and the thickness thereof, which will ultimately be chosen based upon the desired characteristics of the circuit being implemented.

The method for selectively forming sidewall spacers adjacent fin structure 38 continues with the selective removal of spacer material 70 adjacent opposing sidewalls 76, 78 of fin structure 38 (FIG. 11). In the illustrated exemplary embodiment, first and second reactive ion etching (RIE) processes are sequentially performed to remove spacer material 70 adjacent opposing sidewalls 76, 78 of fin structure 38. The RIE processes described below are performed utilizing a plasma chemistry selective to spacer material 70; e.g., if spacer material 70 comprises silicon nitride, the RIE processes can be performed utilizing various chlorine- or fluorine-based chemistries, such as a carbon hydro-trifluoride, a tetrafluoromethane, or a sulfur hexafluoride chemistry. In contrast to conventional wet etches (e.g., hot phosphoric acid etches) typically utilized to remove spacer-forming material, the RIE process is an anisotropic or directional etching process that can be controlled to provide an angled etch. The RIE process can consequently be controlled to remove spacer material 70 laterally adjacent fin structure 38 while leaving intact a substantial portion of spacer material 70 laterally adjacent gate stack 50 in the manner described below. As appearing herein, the phrase "substantial portion" is defined as a portion of spacer material 70 having a volume sufficient to serve as sidewall spacer; e.g., having dimensions sufficient to serve one or more of the purposes described above.

Figure 12:
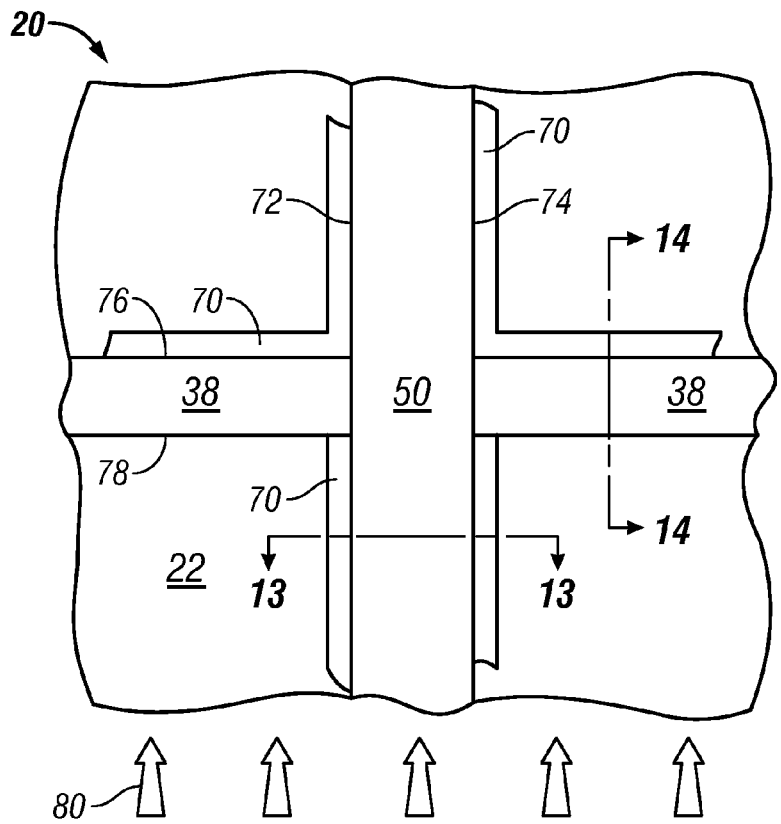
Figure 13:
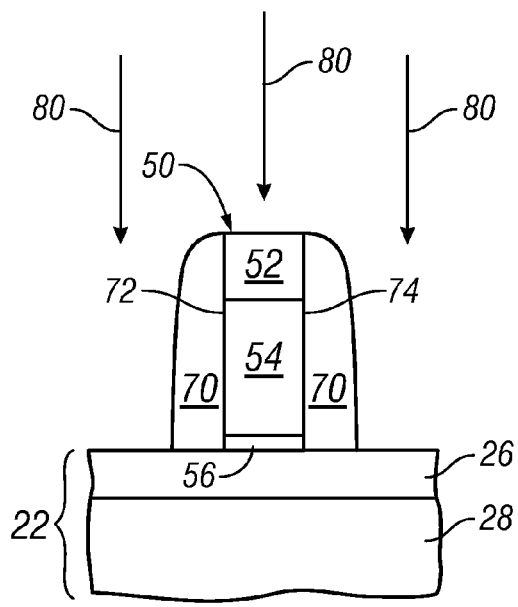
Figure 14:
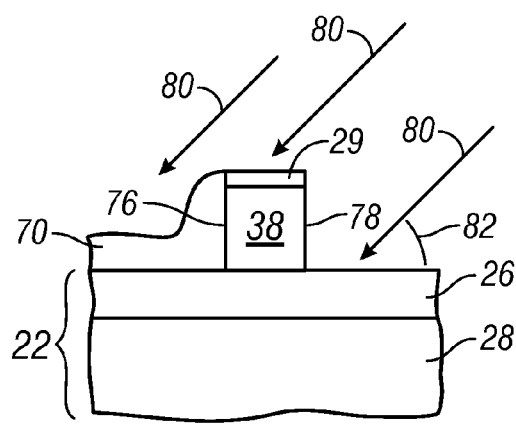

FIG. 12 is a top plan view of partially-competed semiconductor device 20 (partially shown) during a first angled reactive ion etch process (represented in FIG. 12 by arrows 80), FIG. 13 is a cross-sectional view of gate stack 50 taken along line 13-13 (identified in FIG. 12), and FIG. 14 is a cross-sectional view of fin structure 38 taken along line 14-14 (also identified in FIG. 2). During the first RIE process, semiconductor device 20 is bombarded with ions. The first RIE process is controlled such that the ion bombardment occurs from a first predetermined direction, which forms a first predetermined grazing angle with silicon substrate 22 as indicated in FIG. 14 at 82. The first predetermined direction is chosen such that spacer material 70 adjacent sidewall 78 of fin structure 38 is directly exposed to the ion bombardment (shown in FIG. 14) while spacer material 70 adjacent opposing sidewalls 72, 74 of gate stack 50 remains generally unaffected by the ion bombardment. For ease of explanation, the portion of the spacer material that is generally unaffected by the ion bombardment will be described herein as being "substantially shielded" from the ion bombardment. For example, in the context of the present example, it may be stated that spacer material 70 adjacent opposing sidewalls 72, 74 of gate stack 50 is substantially shielded from the ion bombardment by spacer material 70 overlying gate stack 50 (shown in FIG. 13). Stated differently, the lower portion of spacer material 70 laterally adjacent gate stack 50 is protected from the ion bombardment due to the increased thickness of spacer material 70 proximate gate structure 50 in the direction of the impinging ions relative to the thickness of spacer material 70 proximate fin structure 38. Thus, during the first RIE process, spacer material 70 adjacent sidewall of fin structure 38, which is directly exposed to the ion bombardment, is etched away in its entirety as generally illustrated in FIG. 14. In contrast, spacer material 70 adjacent opposing sidewalls 72, 74 of gate stack 50, which is shielded from the ion bombardment, is subjected to little or no etching. As will be appreciated by comparing FIG. 13 to FIG. 10, a portion of spacer material 70 overlying gate stack 50 (and, perhaps, a portion nitride cap 52) is also typically removed during the first RIE process. The first RIE process is preferably controlled such that ions travel along predetermined paths that are each substantially perpendicular to first axis 64 (FIG. 8) and substantially parallel to second axis 66 (FIG. 8) when projected onto the first axis-second axis plane.

Figure 15:
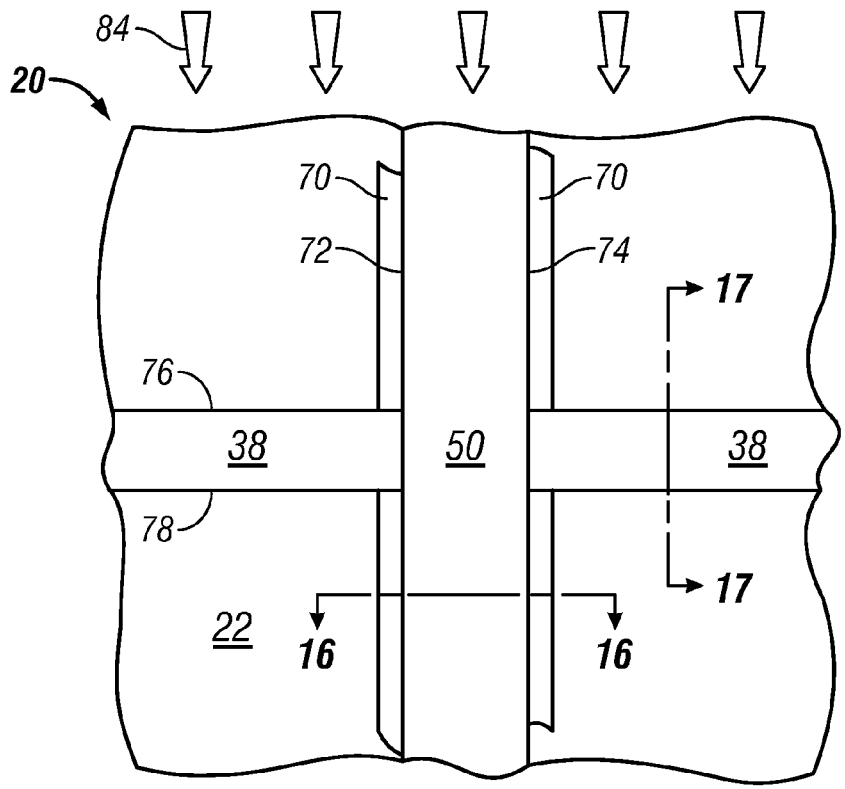
Figure 16:
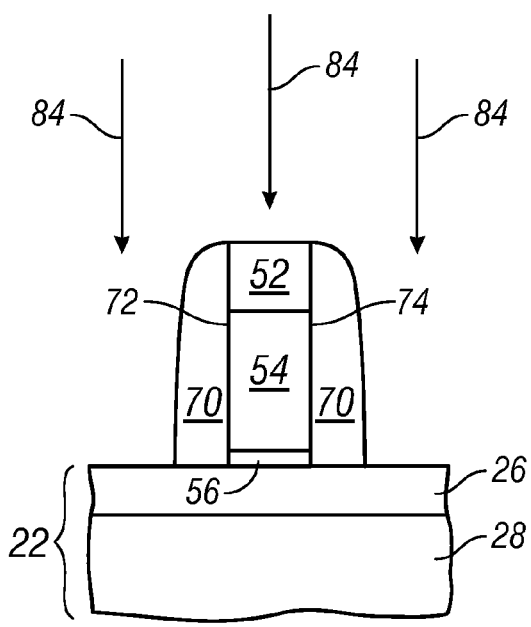
Figure 17:
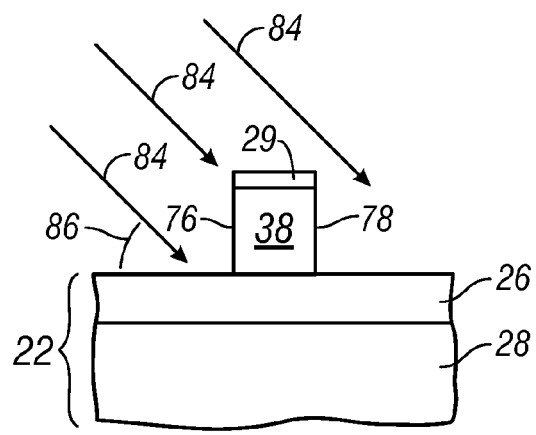

FIG. 15 is a top plan view of semiconductor device 20 (partially shown) during a second angled reactive ion etch process (represented in FIG. 15 by arrows 84), FIG. 16 is a cross-sectional view of gate stack 50 taken along line 16-16 (identified in FIG. 15), and FIG. 17 is a cross-sectional view of fin structure 38 taken along line 17-17 (also identified in FIG. 15). During the second RIE process, semiconductor device 20 is bombarded with ions from a second predetermined direction, which forms a second predetermined grazing angle with silicon substrate 22 (indicated in FIG. 17 at 86). In this case, the second predetermined direction is chosen such that spacer material 70 adjacent opposing sidewall 76 of fin structure 38 is exposed to the ion bombardment (shown in FIG. 14) while spacer material 70 adjacent opposing sidewalls 72, 74 of gate stack 50 is substantially shielded therefrom. Consequently, the second RIE process removes, in its entirety, spacer material 70 adjacent sidewall 76 of fin structure 38 while leaving intact a substantial portion of spacer material 70 adjacent opposing sidewalls 72, 74 of gate stack 50. As was the case previously, a portion of spacer material 70 overlying gate stack 50 and an upper portion of nitride cap 52 may also be removed during the second RIE step.

As stated above, ion bombardment occurs from a first predetermined direction during the first RIE process and from a second predetermined direction during the second RIE process. The first and second predetermined directions are preferably rotational offset by approximately 180 degrees, as rotated about a third axis orthogonal to axes 64 and 66 (labeled in FIG. 8) and normal to silicon substrate 22. The first and second RIE processes can be performed, for example, by placing semiconductor device 20 within the vacuum chamber of a conventional (e.g., parallel plate) reactive ion apparatus. After the first RIE process is performed, semiconductor device 20 can be physically rotated 180 degrees about the third axis prior to the performance of the second RIE process. Semiconductor device 20 can be manually rotated by a technician between RIE processes or, instead, semiconductor device 20 can be placed on a chuck within the vacuum chamber that automatically rotates 180 degrees after the first RIE process is completed. Alternatively, the directionality of ion bombardment can be altered from the first RIE process to the second RIE process by manipulating a magnetic field and/or an electrical field produced within the vacuum chamber of the reactive ion apparatus. A physical marker provided on the semiconductor wafer, such as the wafer notch, can serve as a convenient spatial reference for aligning semiconductor device 20 with respect to the reactive ion apparatus to ensure that ion bombardment occurs from the desired directions during the RIE processes.

As previously noted, ion bombardment occurs from a first predetermined direction that forms a first predetermined grazing angle with substrate 22 during the first RIE process and from a second predetermined direction that forms a second predetermined grazing angle with substrate 22 during the second RIE process. The first predetermined grazing angle is preferably equivalent to the second predetermined grazing angle. In addition, the first and second predetermined grazing angles are each preferably acute and, still more preferably, between approximately 35 degrees and 55 degrees. In one specific example, the first and second predetermined grazing angles may each be chosen to be approximately 45 degrees. In this case, over-etching can be limited to approximately 100% of ideal thickness removal in planar regions and approximately 25-50% of ideal thickness removal proximate fin structure 38 and the field regions immediately adjacent fin structure 38. When practicable, the first and second predetermined grazing angles can also be increased above 45 degrees (e.g., between approximately 70 and 75 degrees) to increase the rate of removal of spacer material 70 laterally adjacent fin structure 38 relative to the rate of removal of spacer material 70 laterally adjacent gate stack 50 and, therefore, to further minimize and potentially eliminate over-etching requirements.

It should thus be appreciated that there has been provided a first exemplary embodiment of a method for selectively forming sidewall spacers adjacent opposing sidewalls of one or more gate stacks included within a non-planar semiconductor device. In the above-described exemplary embodiment, one or more angled etching processes, in particular two reactive ion etching processes, were utilized to selectively remove spacer material laterally adjacent the fin structures while leaving intact a substantial portion of the spacer material from laterally adjacent the gate stack. Although, in the foregoing example, the method was specifically utilized to form sidewall spacer adjacent opposing sidewalls of one or more gate stacks included within a FinFET, embodiments of the method are generally useful for selectively forming sidewall spacers adjacent a first vertical surface (or surfaces) of a small scale electronic device without simultaneously forming a sidewall spacer adjacent a second vertical surface (or surfaces) generally perpendicular to the first vertical surface.

In alternative embodiments of the fabrication method, sidewall spacers are formed adjacent selected surfaces of a non-planar electronic device utilizing a contaminating process wherein at least one ions species is implanted in selected areas of a deposited spacer material to enhance and/or retard removal of the spacer material during one or more subsequent etching processes. In certain embodiments, ions that enhance the removal rate of the spacer material during etching are implanted into the spacer material adjacent vertical surface or surfaces along which it is desired to form sidewall spacers. In further embodiments, ions that retard the removal rate of the spacer material during etching are implanted into the spacer material adjacent vertical surface or surfaces along which it is desired to prevent the formation of sidewall spacers. In still further embodiments, a combination of these two approaches is utilized. To further illustrate this point, the following describes a second exemplary embodiment of a method for selectively forming sidewall spacers adjacent opposing sidewalls 72, 74 of gate stack 50 after the deposition of at least one layer of spacer forming material 70 as shown in FIGS. 9-11 and described above.

Figure 18:
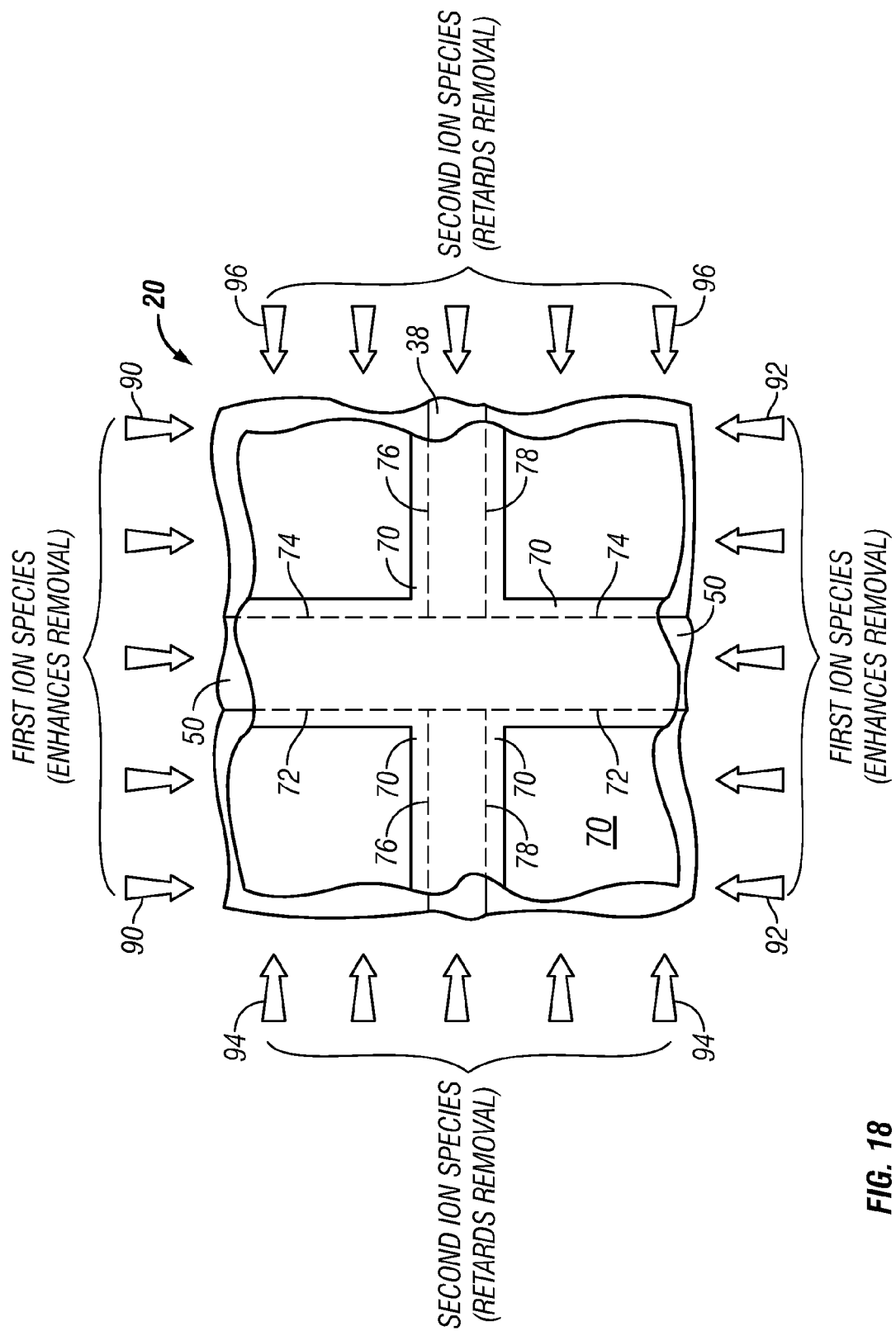
FIGS. 18 and 19 are simplified top views illustrating various steps included within a second exemplary method for selectively producing sidewall spacers adjacent the gate stack included within the exemplary FinFETs illustrated in FIGS. 1-8.

FIG. 18 is a top plan view of partially-competed semiconductor device 20 (partially shown) generically illustrating a number of selective contamination steps that can be performed during a second exemplary embodiment of the spacer-forming method. In particular, and as indicated in FIG. 18 by arrows 90, a first angled ion bombardment can be performed to implant a first ion species into spacer material 70 adjacent sidewall 76 of fin structure 38. The first species of ions enhances the removal rate of spacer material 70 relative the removal rate of the unimplanted material during a selected etching process. The first species of ions can be any ion species that renders the implanted spacer material more susceptible to an etchant than the unimplanted material as is readily known in the art. For example, the first species of ions can comprise arsenic ions as arsenic-implanted silicon oxide etches more readily than unimplanted silicon oxide during certain known etching processes. As was previously the case, the ion bombardment is controlled such that spacer material 70 adjacent sidewall 78 of fin structure 38 is directly exposed to the ion bombardment while spacer material 70 adjacent opposing sidewalls 72, 74 gate stack 50 is substantially shielded from the ion bombardment by spacer material 70 overlying gate stack 50. Similarly, as indicated in FIG. 18 by arrows 92, a second angled ion bombardment is performed, either simultaneously with or sequential to the first angled ion bombardment, to selectively implant the first ion species into spacer material 70 adjacent opposing sidewall 78 of fin structure 38. Again, spacer material 70 adjacent opposing sidewalls 72, 74 gate stack 50 is substantially shielded from the ion bombardment by spacer material 70 overlying gate stack 50. Pursuant to the performance of both ion bombardment processes, spacer material 70 adjacent opposing sidewalls 76, 78 of fin structure 38 becomes heavily implanted with the first species of ions. A portion of spacer material 70 overlying gate stack 50 and fin structure 38 may also become heavily implanted with the first species of ions. By comparison, spacer material 70 adjacent opposing sidewalls 72, 74 of gate stack 50 receives little to no implantation of the first ion species.

In addition to, or in lieu of, implanting the first ion species into spacer material 70 adjacent opposing sidewalls 76, 78 of fin structure 38, a second ion species can be implanted into spacer material 70 adjacent opposing sidewalls 72, 74 of gate stack 50. The second ion species retards the removal rate of spacer material 70 relative to the removal rate of the unimplanted material during the selected etching process. In one embodiment, the second ion species comprises boron ions. In this particular case, the first angled ion bombardment (represented in FIG. 18 by arrows 94) is controlled such that spacer material 70 adjacent sidewall 72 of gate stack 50 is directly exposed to the ion bombardment while spacer material 70 adjacent sidewalls 76, 78 of fin structure 38 is substantially shielded therefrom. Similarly, during the second angled ion bombardment (represented in FIG. 18 by arrows 96), spacer material 70 adjacent opposing sidewall 74 of gate stack 50 is directly exposed to the ion bombardment while spacer material 70 adjacent sidewalls 76, 78 of fin structure 38 is substantially shielded therefrom. As a result, spacer material 70 adjacent opposing sidewalls 72, 74 of gate stack 50 becomes heavily implanted with the second species of ions, as does a portion of spacer material 70 overlying gate stack 50 and fin structure 38. In contrast, spacer material 70 adjacent opposing sidewalls 76, 78 of fin structure 38 receives little to no implantation of the second ion species.

Figure 19:
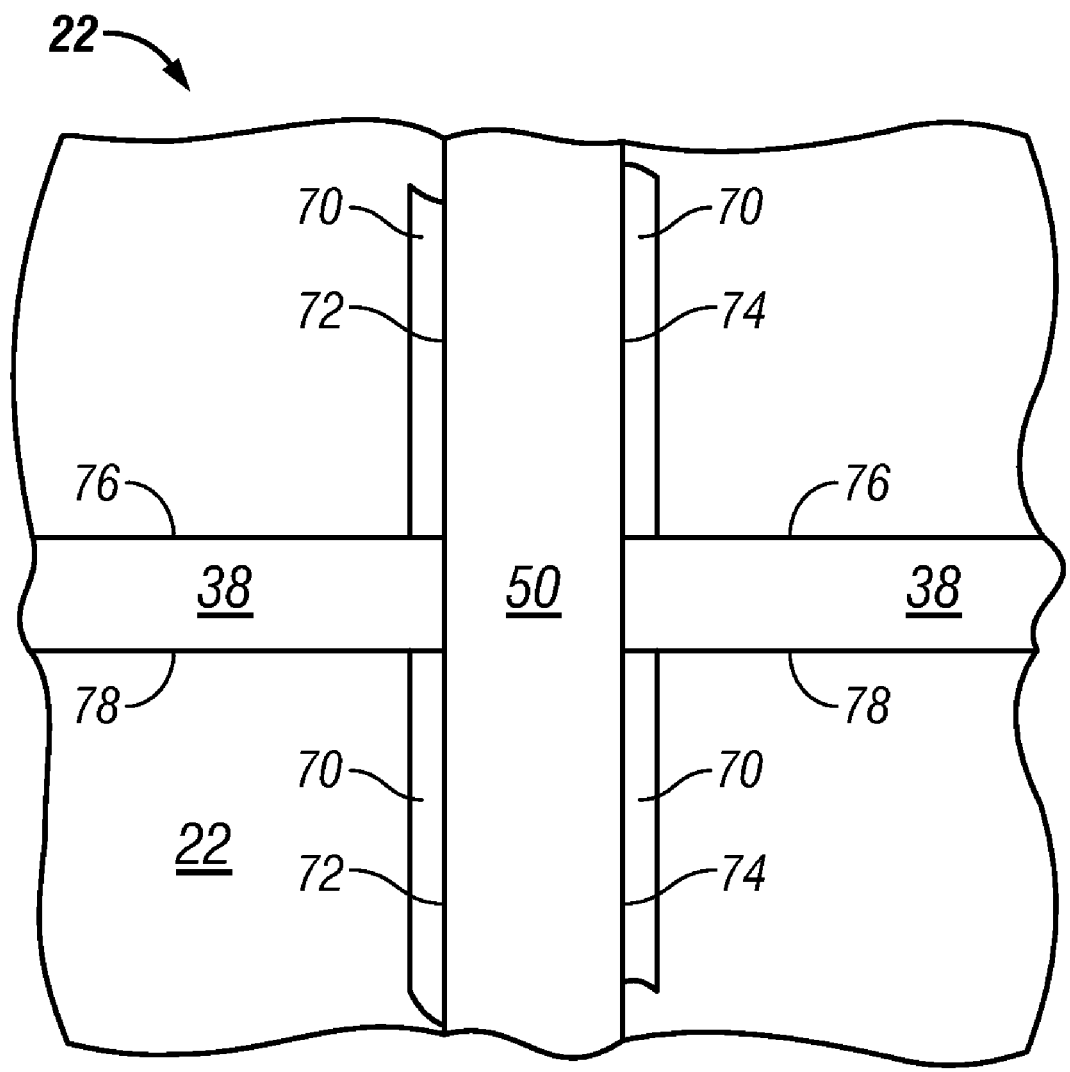

With reference to FIG. 19, the selected etching process is next performed. The selected etching process can be any etching process, wet or dry, suitable for removing spacer material 70. During the selected etching process, spacer material 70 adjacent opposing sidewalls 76, 78 of fin structure 38, which has been implanted with the first ion species as described above, etches away at a relatively rapid rate of removal. In contrast, spacer material 70 adjacent opposing sidewalls 72, 74 of gate stack 50, which has been implanted with the second ion species, etches away at a relatively slow rate of removal. Thus, when limited to an appropriate duration, the selected etching process removes spacer material 70 adjacent opposing sidewalls 76, 78 of fin structure 38 in its entirety, while leaving intact a substantial portion of spacer material 70 adjacent opposing sidewalls 72, 74 of gate stack 50. Spacer material 70 overlying gate stack 50 and fin structure 38 is also removed during the selected etching process as indicated in FIG. 19. In this manner, sidewall spacers are selectively formed adjacent opposing sidewalls 72, 74 of gate stack 50 without the simultaneous formation of parasitic sidewall spacers adjacent fin structure 38. In addition, over-etching is significantly reduced as compared to conventional spacer-forming methods of the type described above.

In view of the foregoing, there has been provided multiple exemplary embodiments of a method suitable for fabricating a non-planar, multi-gate semiconductor device, such as a FinFET, wherein sidewall spacers are selectively formed adjacent opposing sidewalls of a gate or gates that minimizes or eliminates over-etching. While exemplary embodiments of the method have been described above in conjunction with a semiconductor device including a number of FinFETs, it should be appreciated that embodiments of the method are equally applicable to other small scale electronic devices, such as micromachined devices and optical devices. Stated differently, embodiments of the method described herein are generally useful for forming sidewall spacers adjacent selected surfaces without simultaneously forming sidewall spacers adjacent other surfaces of an electronic device of the type that includes a substrate (e.g., silicon substrate 22 shown in FIGS. 1-19), a first raised structure (e.g., fin structures 38 shown in FIGS. 2-19) formed on the substrate along a first axis (e.g., axis 64 shown in FIG. 8), and a second raised structure (e.g., gate stack 50 shown in FIGS. 7-19) formed on the substrate along a second axis (e.g., axis 66 shown in FIG. 8) substantially perpendicular to the first axis.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an electronic device having at least one sidewall spacer formed adjacent a selected surface, the electronic device including a substrate, a first raised structure formed on the substrate along a first axis, and a second raised structure formed on the substrate along a second axis substantially perpendicular to the first axis, the method comprising the steps of:
    depositing spacer material overlying the first raised structure and the second raised structure; and
    selectively removing spacer material laterally adjacent one of the first raised structure and the second raised structure, the step of selectively removing comprising:
        bombarding the electronic device with ions from a first predetermined direction forming a first predetermined grazing angle with the substrate such that the spacer material adjacent a first sidewall of the first raised structure is substantially exposed to the ion bombardment while the spacer material adjacent opposing sidewalls of the second raised structure is substantially shielded therefrom.

2. A method according to claim 1 wherein the step of selectively removing further comprises bombarding the electronic device with ions from a second predetermined direction forming a second predetermined grazing angle with the substrate such that the spacer material adjacent a second opposing sidewall of the first raised structure is substantially exposed to the ion bombardment while the spacer material adjacent opposing sidewalls of the second raised structure is substantially shielded therefrom.

3. A method according to claim 1 wherein the step of bombarding comprises performing an angled anisotropic etch to remove the spacer material adjacent the first sidewall of the first raised structure while leaving intact a substantial portion of the spacer material laterally adjacent the second raised structure.

4. A method according to claim 3 wherein the step of performing an angled anisotropic etch comprises performing a reactive ion etch.

5. A method according to claim 1 wherein the step of bombarding comprises implanting a first ion species into the spacer material adjacent the first sidewall of the first raised structure, the first ion species enhancing the removal rate of spacer material during a selected etching process.

6. A method according to claim 5 wherein the step of selectively removing further comprises performing the selected etching process to remove the spacer material adjacent the first sidewall of the first raised structure while leaving intact a substantial portion of the spacer material laterally adjacent the second raised structure.

7. A method according to claim 6 wherein the step of implanting a first ion species comprises implanting arsenic ions into the spacer material adjacent the first sidewall of the first raised structure.

8. A method according to claim 5 wherein the step of selectively removing further comprises implanting a second ion species into the spacer material adjacent the opposing sidewalls of the second raised structure, the second ion species retarding the removal rate of spacer material during the selected etching process.

9. A method according to claim 8 wherein the step of implanting the second ion species comprises implanting boron ions into the spacer material adjacent the opposing sidewalls of the second raised structure.

10. A method according to claim 2 wherein the step of selectively removing further comprises rotating the electronic device by approximately 180 degrees about a third axis substantially orthogonal to the first axis and the second axis, the step of rotating performed after the step of bombarding the electronic device with ions from a first predetermined direction and prior to the step of bombarding the electronic device with ions from a second predetermined direction.

11. A method according to claim 2 wherein the step of bombarding the electronic device with ions from a second predetermined direction comprises altering at least one of a magnetic field and an electrical field to guide ions along the second predetermined direction.

12. A method according to claim 1 wherein the step of bombarding comprises bombarding the electronic device with ions from a first predetermined direction that forms an acute grazing angle with the substrate.

13. A method according to claim 12 wherein the step of bombarding comprises bombarding the electronic device with ions from a first predetermined direction that forms a grazing angle between approximately 35 degrees and approximately 55 degrees.

14. A method according to claim 1 wherein the step of bombarding comprises bombarding the electronic device with ions along a plurality of predetermined paths that, when projected onto the first axis-second axis plane, are each substantially perpendicular to the first axis and substantially parallel to the second axis.

15. A method for fabricating an electronic device having at least one sidewall spacer formed adjacent a selected surface, the electronic device including a substrate, a fin structure formed on the substrate along a first axis, and a gate stack formed on the substrate along a second axis substantially perpendicular to the first axis, the method comprising the steps of:
    depositing spacer material overlying the fin structure and the gate stack; and
    selectively removing spacer material laterally adjacent the fin structure while leaving intact a substantial portion of the spacer material laterally adjacent the gate stack, the step of selectively removing comprising:

bombarding the multi-gate semiconductor device with ions from a first predetermined direction forming an acute grazing angle with the substrate such that the spacer material adjacent a first sidewall of the fin structure is substantially exposed to the ion bombardment while the spacer material adjacent opposing sidewalls of the gate stack is substantially shielded therefrom; and bombarding the multi-gate semiconductor with ions from a second predetermined direction forming a second acute grazing angle with the substrate such that the spacer material adjacent a first sidewall of the fin structure is substantially exposed to the ion bombardment while the spacer material adjacent opposing sidewalls of the gate stack is substantially shielded therefrom.

16. A method according to claim 15 wherein the step of bombarding the multi-gate semiconductor device with ions from a first predetermined direction comprises selectively implanting a first ion species into the spacer material adjacent the first sidewall of the fin structure, the first ion species enhancing the removal rate of the spacer material during a selected etching process.

17. A method according to claim 16 wherein the step of bombarding the multi-gate semiconductor device with ions from a second predetermined direction comprises selectively implanting the first ion species into the spacer material adjacent the second sidewall of the fin structure, and wherein the method further comprises the step of performing the selected etching process to remove the spacer material adjacent the first sidewall of the fin structure while leaving intact a substantial portion of the spacer material laterally adjacent the gate stack.

18. A method according to claim 15 wherein the steps of bombarding the multi-gate semiconductor device with ions from a first predetermined direction and from a second predetermined direction comprise performing a first angled reactive ion etch and a second angled reactive ion etch, respectively.

19. A method for fabricating a semiconductor device having at least one sidewall spacer formed adjacent a selected surface, the semiconductor device including a substrate, a fin structure formed on the substrate along a first axis, and a gate stack formed on the substrate along a second axis substantially perpendicular to the first axis, the method comprising the steps of:

depositing spacer material overlying the fin structure and the gate stack;

performing a first angled anisotropic etch from a first predetermined direction to remove the spacer material adjacent a first sidewall of the fin structure while leaving intact a substantial portion of the spacer material laterally adjacent the gate stack; and performing a second angled anisotropic etch from a second predetermined direction to remove the spacer material adjacent a second opposing sidewall of the fin structure while leaving intact a substantial portion of the spacer material laterally adjacent the gate stack, the second predetermined direction rotationally offset from the first predetermined direction by approximately 180 degrees, as rotated about a third axis substantially orthogonal to the first and second axes.

20. A method according to claim 19 wherein the steps of performing a first angled anisotropic etch and a second angled anisotropic etch comprise performing a first angled reactive ion etch and a second angled reactive ion etch, respectively.

\* \* \* \* \*